United States Patent [19]

Guditz et al.

[11] 4,150,177
[45] Apr. 17, 1979

[54] METHOD FOR SELECTIVELY NICKELING A LAYER OF POLYMERIZED POLYESTER RESIN

[75] Inventors: Elis A. Guditz; Robert L. Burke, both of Lexington, Mass.

[73] Assignee: Massachusetts Institute of Technology, Cambridge, Mass.

[21] Appl. No.: 847,532

[22] Filed: Nov. 1, 1977

Related U.S. Application Data

[60] Continuation of Ser. No. 672,225, Mar. 31, 1976, abandoned, which is a division of Ser. No. 446,865, Feb. 28, 1974, Pat. No. 3,965,277, which is a continuation-in-part of Ser. No. 251,754, May 9, 1972, abandoned.

[51] Int. Cl.² .......................... B05C 3/02; B44D 1/06; C03C 17/00; C03C 21/00
[52] U.S. Cl. ..................................... 427/259; 96/36.2; 96/38.4; 156/645; 156/668; 204/32 S; 427/430 A; 427/92; 427/282; 427/306; 427/307; 427/322
[58] Field of Search ..................... 96/36.2, 38.4, 48 R, 96/35.1; 427/88, 89, 98, 259, 282, 306, 307, 322, 430, 92; 174/68.5; 29/576, 590, 591, 578; 204/15, 32, 32 S; 428/901; 156/668, 645

[56] References Cited

U.S. PATENT DOCUMENTS

| | | | |
|---|---|---|---|
| 3,481,777 | 12/1969 | Spannhake | 427/98 |
| 3,507,681 | 4/1970 | Cooper | 427/306 |
| 3,573,973 | 4/1971 | Drotar et al. | 427/98 |
| 3,640,765 | 2/1972 | Distefano et al. | 96/36.7 X |
| 3,672,925 | 6/1972 | Feldstein | 96/38.4 UX |

Primary Examiner—William A. Powell
Attorney, Agent, or Firm—Arthur A. Smith, Jr.; Martin M. Santa

[57] ABSTRACT

A method of selectively nickeling a layer of polymerized polyester resin is described. Patterns of electrically conducting nickel are produced on the resin surface by etching the surface of the resin prior to covering the etched surface with a patterned layer of unetched resin which exposes the etched resin in the regions in which metallization is to occur. A palladium plating solution followed by an immersion boron-nickel bath provide the metalization on the etched regions of the resin.

4 Claims, 16 Drawing Figures

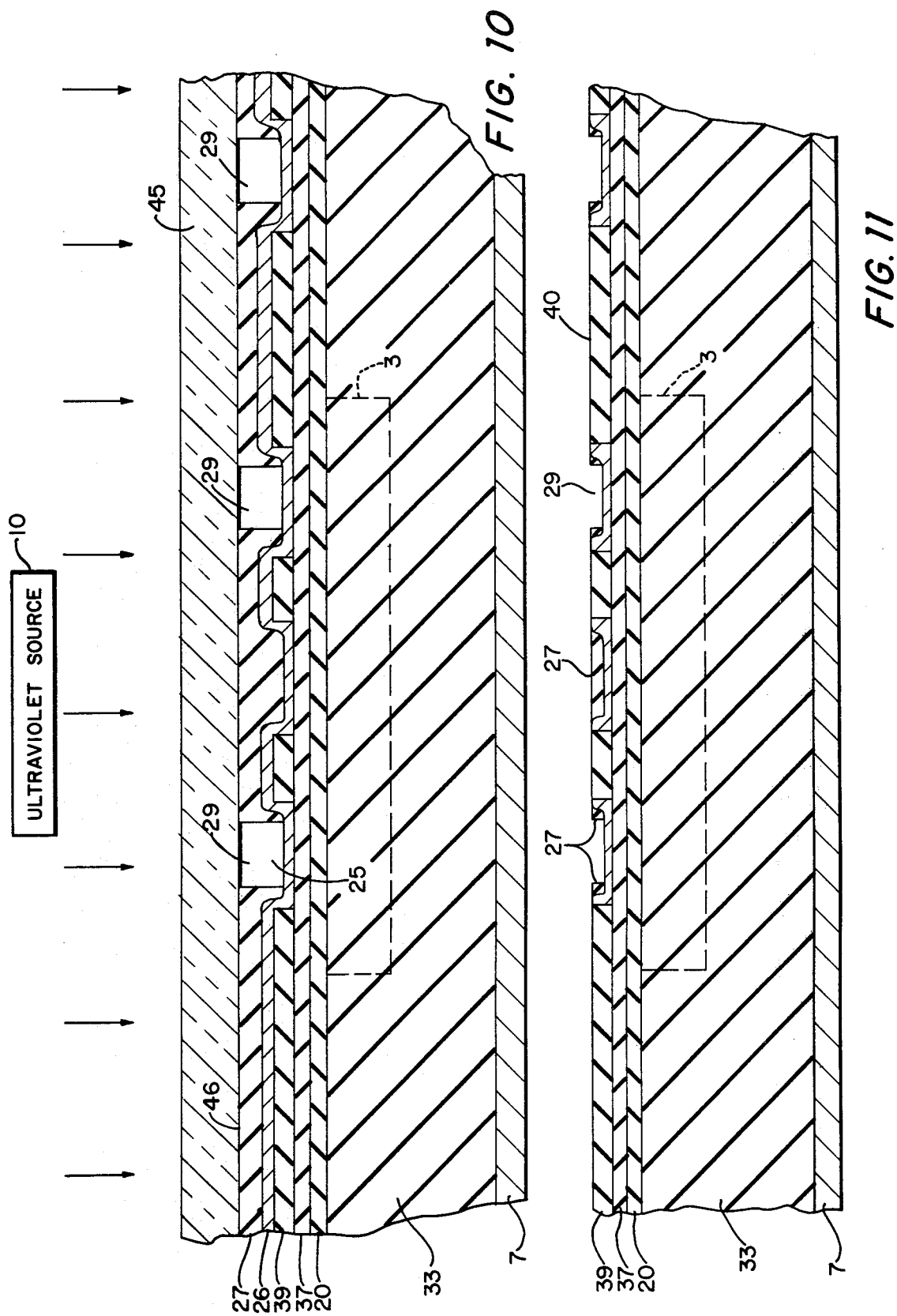

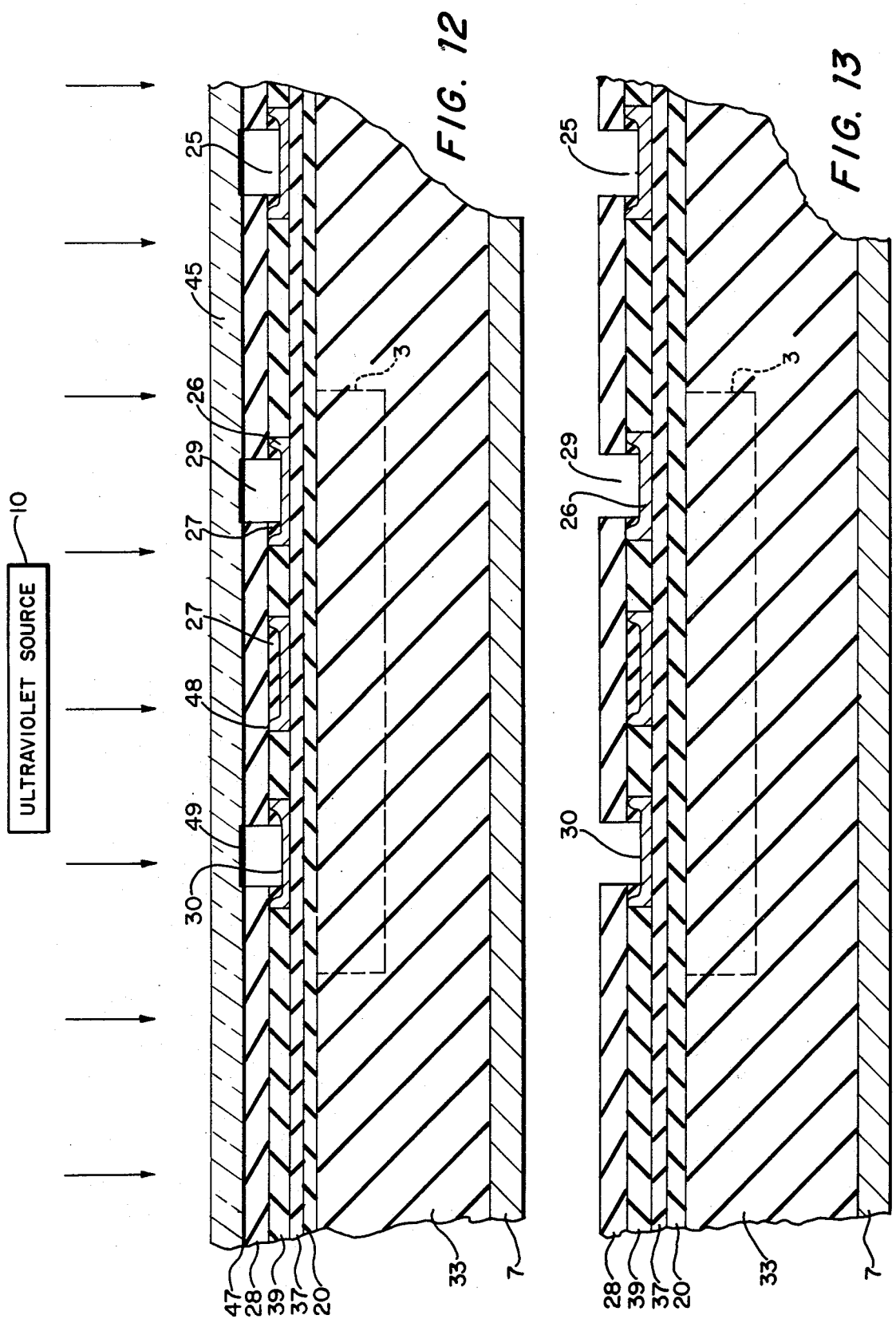

METHOD FOR SELECTIVELY NICKELING A LAYER OF POLYMERIZED POLYESTER RESIN

THE INVENTION

The invention herein described was made in the course of work performed under a contract with the Electronic Systems Division, Air Force Systems Command, United States Air Force.

This application is a continuation of copending application Ser. No. 672,225, filed Mar. 31, 1976, now abandoned, which was a division of a copending application Ser. No. 446,865, filed Feb. 28, 1974, now U.S. Pat. No. 3,965,277, which was a continuation-in-part of copending application Ser. No. 251,754, filed May 9, 1972, now abandoned.

The invention relates to a method for selectively nickeling the surface of a layer of polymerized resin to provide conductive paths thereon and conductive paths between layers of polymerized resin as part of the method for interconnecting circuit chips to form an array of chips in one package.

SUMMARY OF THE INVENTION

A process is described for forming the cconductor paths for electrically interconnecting a group of integrated circuit chips to form an array structure in which the chips are embedded in an insulating plastic. The plastic secures the chips mechanically and provides the base for the conductors which connect the terminal pads of the chips to the pads of other chips or to the external connection terminals of the array by means of photoformed plated conductors on the plastic. These conductors may be formed as multilayer wiring where the layers of conductors are insulated from one another by insulating layer of plastic. The conductors in the different layers are selectively connected to one another, layer to layer, by means of conducting vias through the insulation layers. Each chip is connected to a heat sink through thermal paths from the bottom of the chips.

BACKGROUND OF THE INVENTION

The concept of semiconductor integration is based on the ability to batch fabricate, at relatively low cost, large numbers of interconnected circuit elements on a single chip through the use of photolithographic techniques. It is desired to develop a method for extending similar techniques to connections between chips so that the same advantages might be realized at the next level of system interconnection. The invention described herein was developed as a rapid means of interconnecting integrated circuit chips which might be thought of as providing an alternative to putting more and more complexity onto a single chip and having the potential for eliminating entirely mechanical bonding, thus achieving a qualitative improvement in the economy, reliability, density, and electrical characteristics of interchip connections by having close chip spacing, good heat sinking, and multi-level wiring.

The problems to be resolved included how to form conductors and connect them to the aluminum chip pads and what material should be used for insulation in the dielectric layer between the chips and the wiring which could be selectively removed to provide access to the chip pads. Of concern also was the compatibility of chips and array materials with processing chemicals. Finally, it was recognized that the completed array should be capable of tolerating laboratory and industrial environments including the thermal stresses resulting from normal heat dissipation during circuit operation.

A process has been developed which achieves the above goals with the use of relatively simple procedures and inexpensive equipment. Use is made of the techniques of plastic embedment electroless metal plating, electroplating, and photoforming of plastics. Important features of the process include batch plating of connections to chips, photoforming of multiple insulating layers and conductor grooves for high density packaging, and efficient removal of heat from the chips. Processing temperatures do not exceed 70° C.

BRIEF DESCRIPTION OF THE DRAWINGS

FIGS. 1–16 show views of the chip array in progressive steps in the process of its construction.

DESCRIPTION OF THE PREFERRED PROCESS

Figure 1:
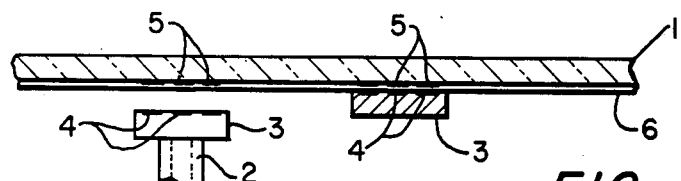

Silicon integrated circuit chips 3, preferably passivated, are temporarily positioned in the desired array location by impressing the chips, face-up, into a transparent adhesive material 6 coated by controlled withdrawal onto a glass mask 1 which contains opaque regions 5 corresponding to the pads of the chips 4, as seen in FIG. 1.

A microscope is used to align the pads on the chips to the opaque regions of the mask 1. The size, shape, and thickness of the chips, or irregularity of chip edges, are unimportant because only the chip pads are used in this alignment procedure.

After removing the unneeded adhesive from the clear side of the mask 1, the mask is placed, pattern down, in an alignment and positioning jig (not shown). This jig is equipped with a hollow vacuum support tube 2 mounted on a grease plate (not shown) for x-y movement and controlled by a hand lever (also not shown) for vertical movement. Each chip 3 is, in turn, placed onto the vacuum tube 2 and the glass mask 1 is placed into position over the tube. The chip pads 4 and the opaque regions 5 on the mask 1 are aligned by horizontal movement of the tube with the assistance of a microscope (not shown) and, when aligned, the chips are pushed up into the adhesive 6 by vertical movement of the tube. As each chip is positioned, the vacuum is released, the probe retracted, and the glass mask withdrawn to allow placement of another chip on the tube. The procedure is repeated until all the chips are adhered to the mask.

After the chips have been aligned and adhered, a silica powder is sprayed onto the adhesive to impart a surface roughness to the plastic which is subsequently used to embed the chips. This surface roughness increases the adhesion between the array embedment plastic and the next layer of plastic to be applied.

In preparation for embedding the chips in resin, the chips and adhesive are coated with a silane coupling agent followed by a thin layer of ultraviolet radiation-sensitized polyester resin. The function of the silane, such as A-174 Silane, Union Carbide Corp., is to enhance the bond of the silicon chips to the polyester resin. The resin preparation is discussed in detail at the end of this specification in the section identified as the "Resin Layers." Polyester resin is used, not only for its excellent dielectric properties but also because, in the liquid state, it can be photosensitized and selectively crosslinked with styrene monomer by irradiation with ultraviolet light.

Figure 2:
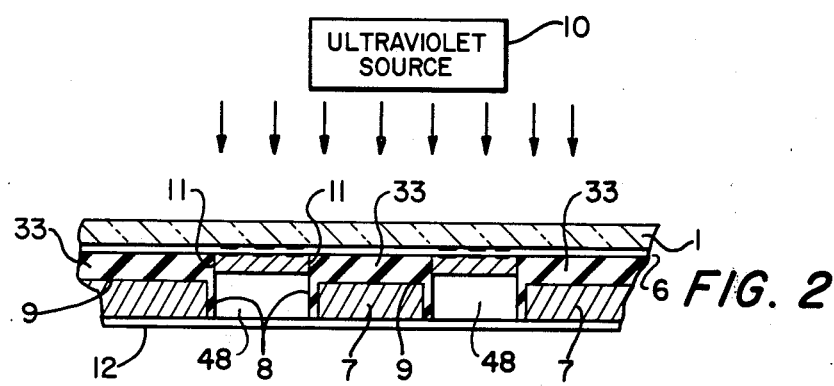

The chips are embedded in resin along with a rigid copper substrate 7 in FIG. 2, which also serves as a heat sink. The copper substrate is one having sufficient thickness, normally 20-40 mils of thickness, to be stiff enough to resist flexing. The copper substrate has apertures of slightly larger size than the chips and these apertures are located at the same location as the chip positions. The copper substrate is oxidized so that it is black to avoid reflection problems. The substrate is dipped in styrene monomer, placed on a polyethylene terephthalate sheet 12, identified hereinafter by its trademarked name Mylar, and then coated with a layer of ultraviolet sensitized polyester resin. The styrene functions as a wetting agent, compatible with the polyester, whose purpose is to prevent the formation of bubbles on the copper substrate.

The mask with the adhered chips and the resin-coated substrate are then placed in contact with one another, with the chips in registration with the apertures of the substrate, as shown in FIG. 2. A jig (not shown) is used in this procedure to achieve the desired thickness of resin.

The chip-substrate combination, hereinafter called an array, next is exposed from the chip side to ultraviolet radiation from source 10 to partially cure the polyester resin. All exposures used in this process are projection exposures for reasons explained in the section "Resin Layers". The radiation is typically the 3500-4000 A° wavelength range and is collimated to reduce spreading and produce accurate control of the polymerized regions. The holes in the copper substrate, being slightly larger than the chips of the array, cause the polyester 33 to be cured at the substrate sides 8 and chip edges 11 as well as above the substrate top surface 9, as shown in FIG. 2. It is seen that the radiation crosslinks the polyester resin to a solid in all regions except the areas 48 where the resin is shaded from the radiation by the chips.

Figure 3:
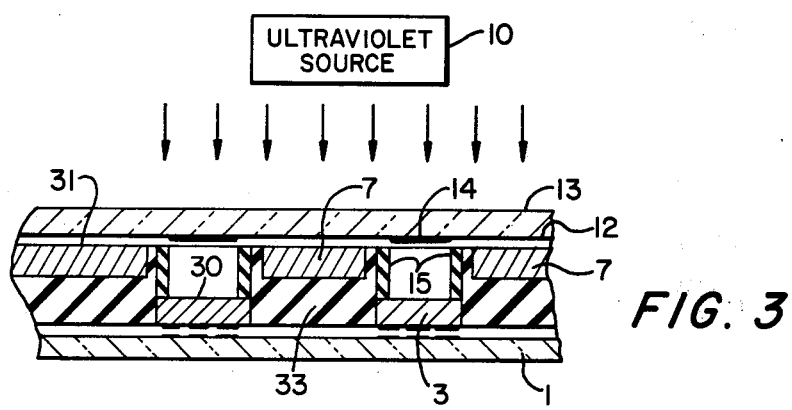

The array assembly is next turned over and exposed to the ultraviolet light from source 10 through the Mylar sheet 12 and a mask 13. The mask 13, as shown in FIG. 3, has opaque masking regions 14 slightly smaller than the chips 3 and in registration therewith so that the chip circumferential region of polyester resin 15 is polymerized to hold chip 3 more securely in its desired position. Also, any polyester that may have found its way between the Mylar sheet 12 and the copper substrate 7 is also polymerized. This thin, undesired flashing layer is easily removed in a subsequent abrading step.

Obviously, a single ultraviolet exposure is possible if radiation is supplied from both sides simultaneously.

The mask 13 and Mylar sheet 12 are removed and the unexposed resin is washed away from the backs 30 of the chips 3. The washing procedure is called development and consists of removing the unexposed resin with styrene monomer, alcohol, aqueous detergent wash, or a combination of these. Application may be by dipping, rinsing, spraying or by low-power ultrasonically agitated washing. The resin cure is completed by exposing the array to radiation from a sunlamp in a nitrogen atmosphere.

Figure 4:
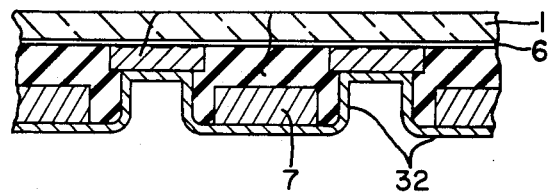

The copper substrate 7 is next caused to have a good thermal connection with the backs of the chips in order to provide a heat sink for the chips, although this step in the fabrication of the array may be done at some later stage of processing. The back surface 31 of the copper substrate 7 and the backs of the chips 30 are mechanically abraded to remove oxide coating and any polyester resin flashing from the substrate and any oxide from the silicon of the chip. With mask 1 still attached, the array is immersed in a plastic etch solution followed by immersions in plating sensitizer solutions. An electroless nickel deposition process deposits nickel on the substrate, the sensitized plastic, and the silicon back of the chip. The backs of the chips are thermally connected to the copper substrate by electroplated copper 32 over the nickel deposit, resulting in the assembly shown in FIG. 4. The detailed steps and chemical compounds used are given at the end of this specification, in the section entitled "Chemical Procedures". Experiments show that with this procedure there is only a 10° C. rise in temperature per watt dissipated per chip compared to a 30°-50° C. rise when the prior art thermally conductive epoxy technique is used to provide the thermal bond between the chips and the copper substrate.

The assembly steps concerned with the back of the array are now complete and attention is directed to the front surface of the array and the steps whereby the chip pads are selectively connected to each other to form an interconnection of chips and to provide external connection terminals.

Figure 5:
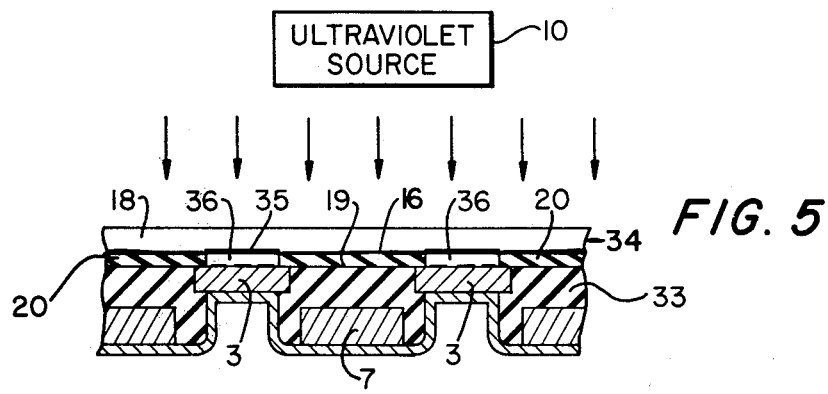
Figure 14:
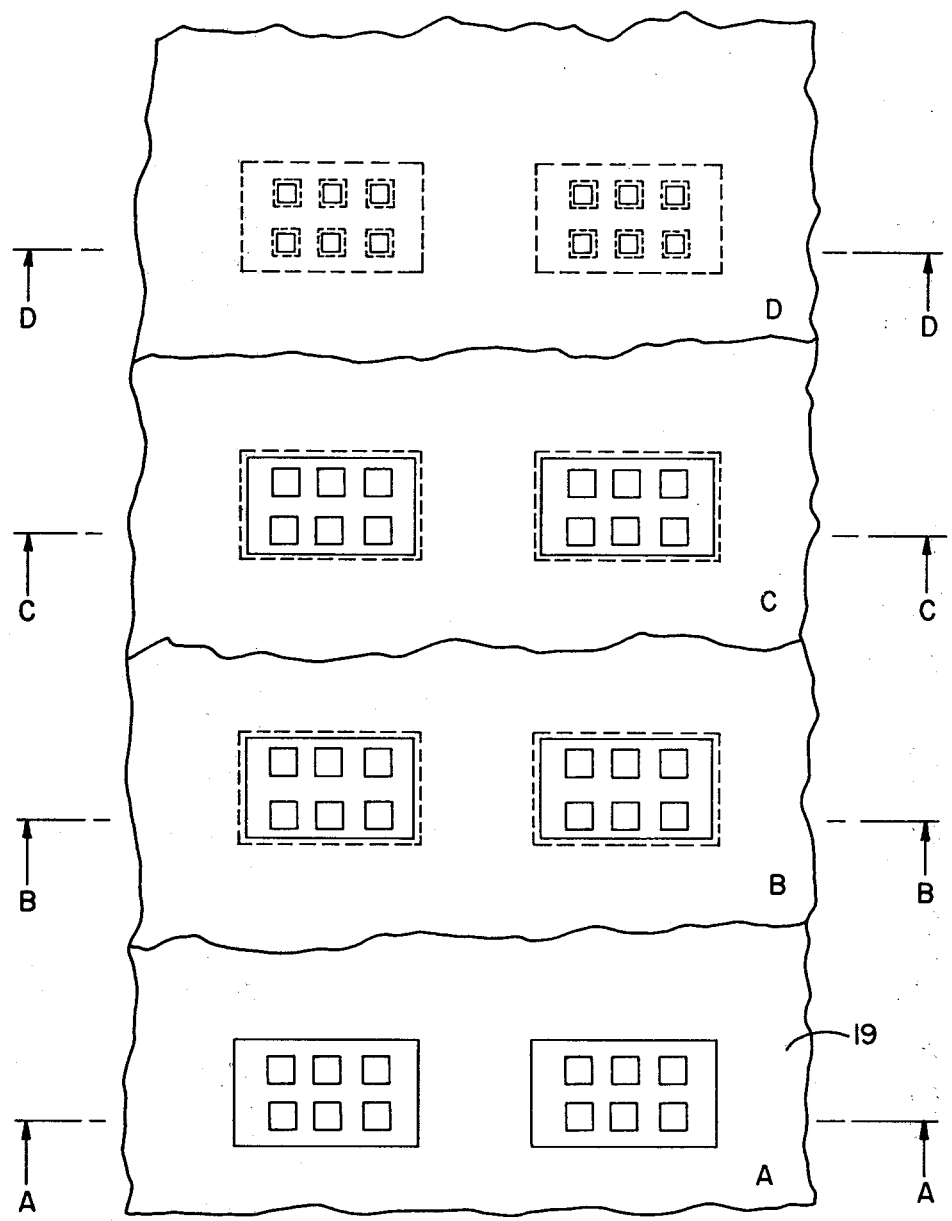

The glass mask 1 can be removed from the face of the chips 3 and the cured resin 33 by virtue of the fact that rubber cement 6 serves as a release agent. Adhesive residue on the face of the array may be removed with a suitable solvent wash, such as rubber cement thinner. FIG. 14, layer A, shows the array surface 19 at this stage of array assembly. FIG. 5 shows the section AA of FIG. 14 prepared for the next exposure. A silane coupling agent is then applied to the array surface 19 to increase the bond between the next layer of polyester to be applied and the chip surface. A layer of U.V. sensitized liquid polyester resin 20 is next spread over the face of the array. A clean Mylar sheet 16 is placed on this layer and a different chromium-on-glass mask 34 with opaque areas 35 slightly smaller than the chip dimension is placed in a jig and lowered onto the Mylar sheet 16 establishing a two-mil thick resin layer. The resin is exposed through the mask 34 with ultraviolet light from source 10 to polymerize that portion of the polyester resin 20 exposed to the light. This process exposes the resin over the scribe line on the face of the chip covering the silicon in the scribe-line area. The mask 34 and polyester sheet 16 are removed and the unexposed resin in region 36 is washed away from the face of the chip so that the chip pads may be metallized. FIG. 14, layer B, shows the array surface ready for metallization of chip pads.

The chips of the array are prepared for interconnection by coating their exposed aluminum pads with electroless nickel. This nickel subsequently becomes overplated with the metal of the interconnection wiring. Uniform plating of aluminum pads of chips with "unprotected" scribe-line areas and other exposed silicon is dependent upon chip complexity and the electrical resistance between pads and the silicon in contact with etching and plating solutions. In the worst case, pads with low resistance to silicon can reject plating entirely and simply erode away. These chips are best metallized after the chips have been encapsulated in plastic and the silicon isolated from the solutions. The detailed steps of metalizing the pads is disclosed under "Metallization of Chip Pads" at the end of this specification in the "Chemical Procedures" section. Obviously, if the chips are supplied with nickel pads, the above metallization procedure is unnecessary.

Chip pads can be coated with electroless nickel prior to embedment by employing the "Improved Pad-metallization Procedure" disclosed at the end of this specification in the "Chemical Procedures" section. Use of this improved metallization procedure obviates the requirement for isolating the chip silicon from the electroless plating bath while metallizing chip pads and insures uniform plating of chip pads through the use of baths of near-neutral pH. Therefore, with the improved pad-metallization procedure, the step of exposing resin layer 20 to cover the chip scribe-line area may be eliminated.

Figure 6:
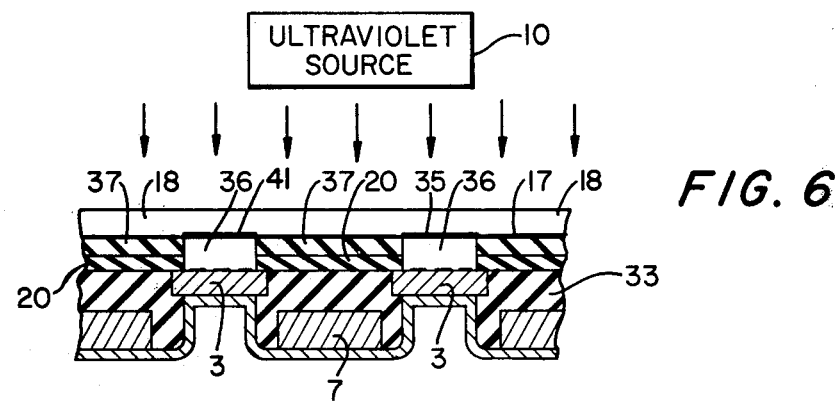

FIG. 6 shows the section BB of FIG. 14, layer B, prepared for the next exposure. After the chip pads have been nickeled, the face of the array is again coated with silane and U.V.-sensitized liquid polyester resin filling the void 36 above the chips and incidentally leaving a thin film 37 of resin on the previously cured resin 20, as shown in FIG. 6.

Figure 7:
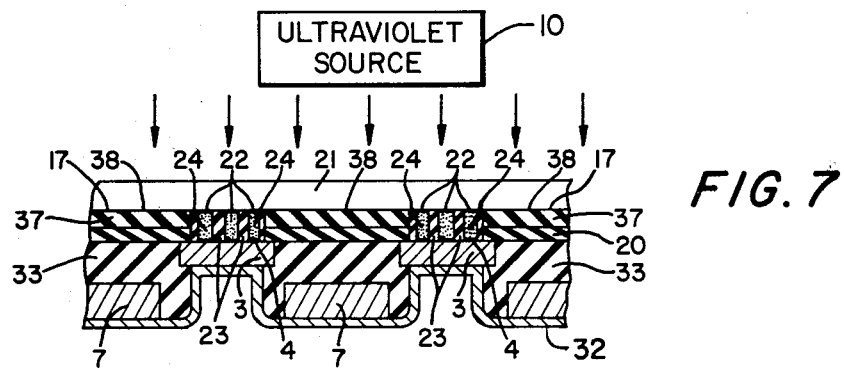

The time required to photocrosslink resin depends on the reflectivity of the surface under the resin. Chip surfaces are highly reflective and the resin cures faster over the chips than over the surrounding resin. For this season, the dielectric layer is crosslinked in a two-step exposure in which first the chips are masked from the light and the resin around them is partially cured. The photopositive mask 18 of the chips with opaque areas 41 is placed in a jig, lowered onto the Mylar sheet 17, and compressed together until a resin thickness over the chips of approximately 2 mils is obtained. Alignment and thickness determination is performed in 45-degree incident yellow light with the aid of a microscope. The size of the shadow cast by the mask is used to determine resin-layer thickness. About five minutes is required to crosslink the resin outside the chip area. The first mask 18 is then removed and a second mask 21 substituted, as shown in FIG. 7, which is a photopositive which has opaque regions 22 corresponding to the required vias 24 to the chip pads and with inter-chip areas 38 opaque to minimize reflections. FIG. 7 shows the section CC of FIG. 14, layer C, prepared for the next exposure. Only a 2-minute exposure is needed to crosslink the previously unexposed resin over the chips. This double-exposure procedure insures that resin in the via-hole region remains unexposed so that it can be completely developed away. As a result of these procedures those regions 23, 37 of resin shown in FIGS. 6 and 7 are polymerized and become solid and is called the via layer.

The mask 21 and the Mylar sheet 17 are removed and the liquid resin under the opaque areas 22 is washed away with styrene monomer and a dip in alcohol, forming vias 24 in the dielectric layer 23, 37. A simple styrene rinse is all that is required for vias larger than about 5-mils square. Smaller vias require a 15 to 30-second styrene spray from an artist's air brush or a 15-second low-power ultrasonically-agitated styrene rinse. To complete the resin cure, the array is placed on a 65° C. hot plate and exposed to ultraviolet light for twenty minutes; or preferably, a sunlamp is used which provides both ultraviolet and infrared radiation, either exposure technique being in a nitrogen atmosphere to exclude the cure inhibiting oxygen. FIG. 14, layer D, shows a top view of the via layer.

Figure 8:
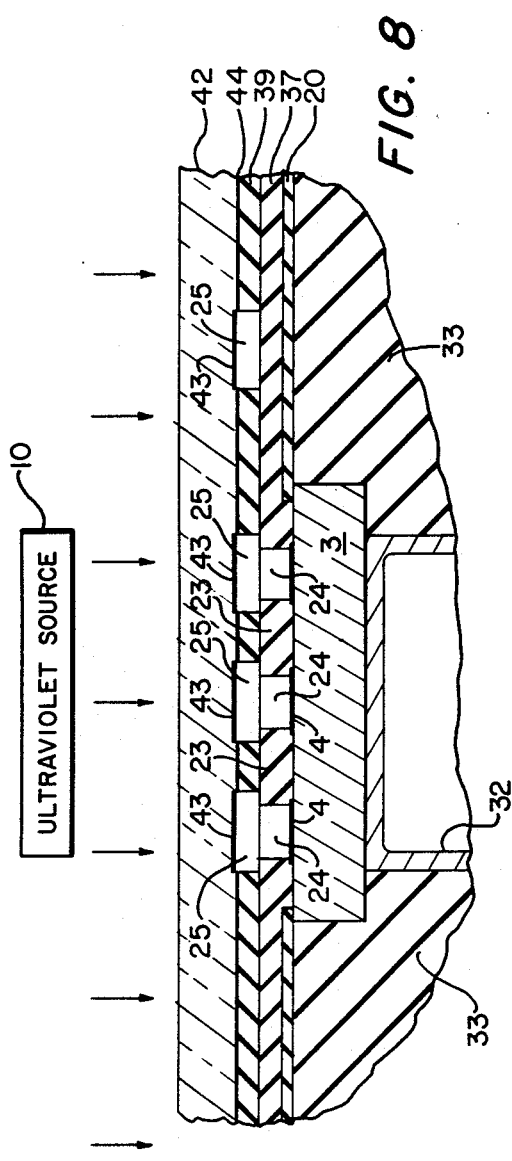
Figure 15:
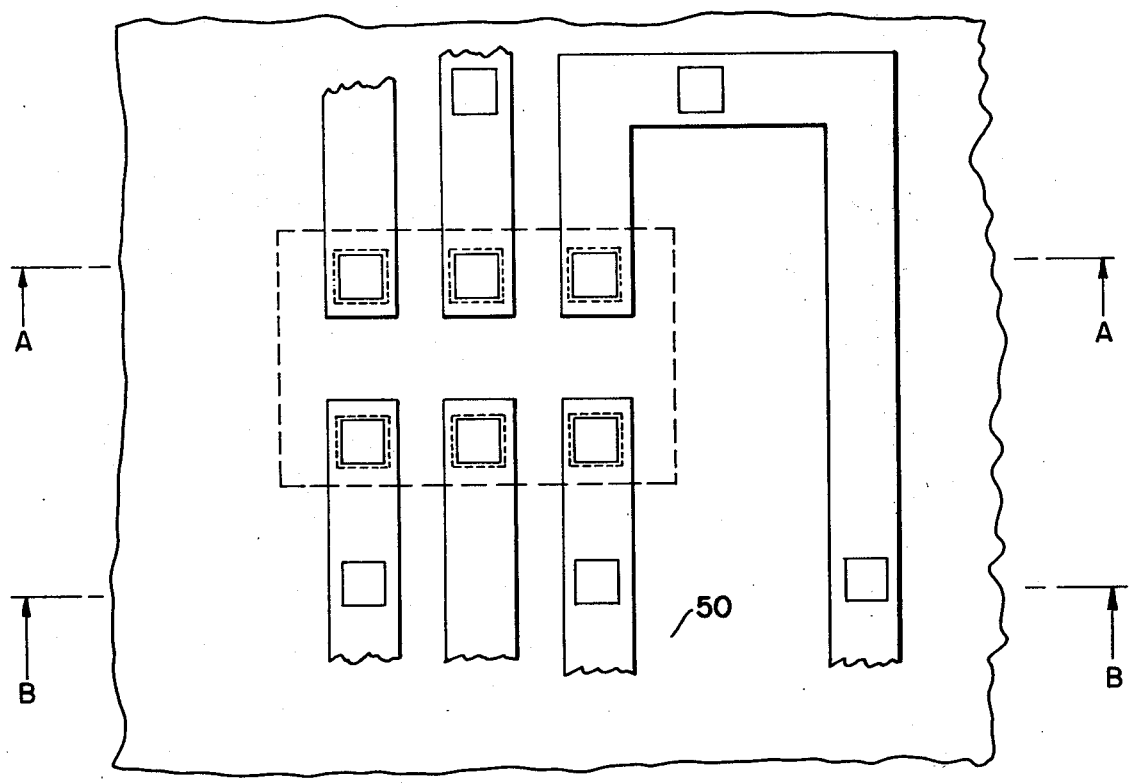

After the via layer of polymerized polyester resin 23,37 of FIG. 7 has been formed, the conductor-groove layer 50 illustrated in FIG. 15 is next provided. FIG. 8 shows the section AA of FIG. 15 prepared for exposure. A layer of U.V.-sensitized liquid polyester resin 39 is spread over the via layer 23, 37. A mask 42 having opaque regions 43 in the form of a conductor pattern is placed on Mylar sheet 44 over the liquid polyester resin 39 in registration with the vias 24 and a resin thickness of about 5 mils established. Ultraviolet radiation from source 10 is again used to solidify the polyester resin except under the opaque regions 43. The mask 42 and Mylar sheet 44 are removed to allow development to remove liquid polyester resin from the grooves 25 in the conductor-groove layer 39 and from the vias 24 in the via layer 23, 37.

Figure 9:
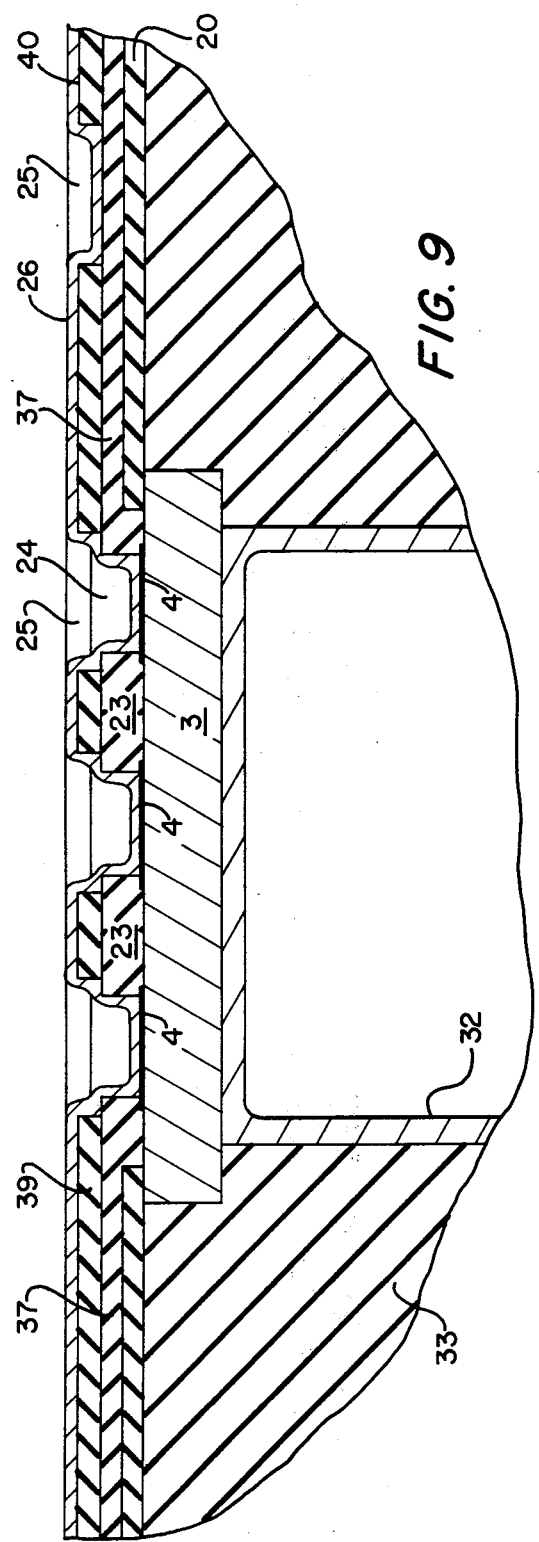

FIG. 9 shows the section AA of FIG. 15 after metallization of grooves, vias, and array surface. The surface 40 of conductor-groove layer 39, the bottom and wall of the grooves 25 and vias 24 (and incidentally the nickeled pads of the chips) are metallized by electroless nickel deposition as described in the "Conductor Metallization" section of "Chemical Procedures" at the end of this specification, followed by electroplated copper to form a layer of copper 26 about 0.3 mil in thickness. The copper is blackened by an oxidizing solution, such as Ebonol C, Enthone, Inc., New Haven, Connecticut, to reduce reflection and to enhance adhesion of subsequently applied polyester resin which is to fill the grooves 25. FIG. 10 shows the Section BB of FIG. 15 prepared for exposure of the next via layer. The grooves 25 and vias 24 of FIG. 9 are filled with polyester resin 27 and exposed to ultraviolet radiation from source 10 through a via mask 45, over a Mylar sheet 46, as in previous exposures. In order to make electrical contact to conductors of the first conductor layer from conductors of the next layer to be applied, the mask 45 has opaque areas 49 slightly smaller than the conductor width so that the resin does not cure, leaving vias 29. It is emphasized that vias 29 are not positioned directly over previously made vias to chip pads. Mask 45 and Mylar sheet 46 are removed and the array developed and cured in a nitrogen atmosphere.

The copper plating 26 on the surface of conductor layer 39 is removed as shown in FIG. 11 by mechanically abrading the surface by machine lapping. The plated walls of the conductor grooves in layer 39 are protected from damage in this abrading process by the solidified polyester resin 27 in the conductor grooves. The vias 29 have a thin layer 27 of polyester resin on their walls sufficient to protect the sidewall metal from damage during abrading.

A polyester via layer 28, as shown in FIG. 12, is then deposited on the conductor layer 39 and on those portions of via layer 27 remaining in the conductor grooves 25 and on the via walls to insulate the top 48 of the sidewall of conductor 26 left uninsulated by the previous abrading step. The mask 45 containing opaque areas 49 in registration with the via region 29 of the grooves 25 in conductor layer 39 is used to mask ultraviolet radiations from source 10 in those via regions 29 and provide access to the bottom 30 of the wiring groove after the via has been developed.

FIG. 13 shows the array with mask 45 and Mylar sheet 47 removed and the unexposed resin developed away. The next layer to be applied would be another conductor layer, containing conductor grooves selectively connected through vias 29 with the previously applied conductors 26. The process of adding more conductor layers separated by via layers is merely a repetition of the steps previously recited. External connection of the chip assembly to a lead-frame type of package is made to the conductors of the last conductor layer in the same manner as for the conductor layers described. Alternatively, land or pads can be provided in the top-conductor layer for soldering or otherwise attaching leads to external terminals.

An alternative improved procedure for forming layered conductors which provides the required selectivity for electroless metal deposition and which eliminates the need for the aforementioned electroplating of layer 26 and its surface abrading in conjunction with layer 27 will now be described.

Figure 16:
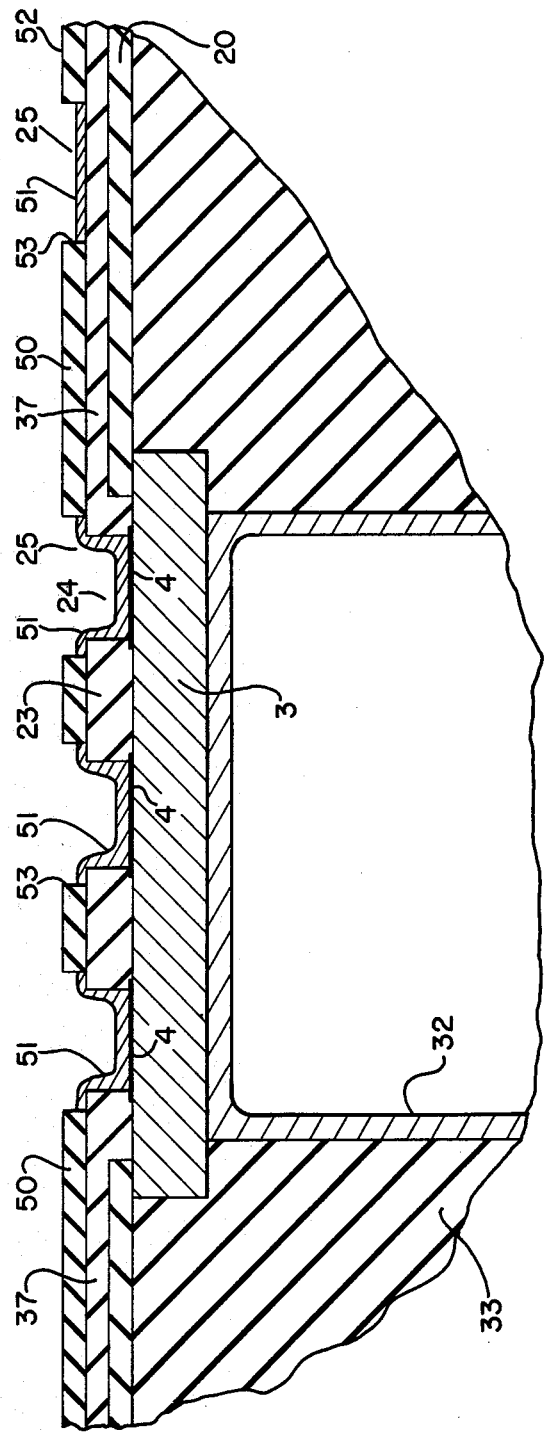

After the via layer of polymerized polyester resin 23, 37 of FIG. 7 has been formed as described previously, the surface of the via layer is etched for 15 to 30 seconds in the plastic etch solution described in the section "Conductor Metallization" under the "Chemical Procedures" section at the end of this specification. Etching prepares the surface for subsequent chemical sensitization and activation in preparation for the deposition of electroless nickel. To mask those areas not to be metallized, a conductor-groove layer 50, illustrated in FIG. 15, is next provided in the same manner as was layer 39. An electroless metal deposition of nickel as described in the "Conductor Metallization" section, if the time of immersion in the nickel bath is increased to approximately one hour, can provide 0.0005 in. thick conductor on the exposed etched regions of the via layer, which is sufficient to provide the required conductivity. FIG. 16 shows the section AA of FIG. 15 after a metallized layer 51 is deposited on the bottom of the grooves, the vias, and the chip pads. It is emphasized that only these regions become metallized because they are the only areas of the previously etched via-layer surface which remain uncovered by the conductor groove layer 50. The top surface 52 of the conductor-groove layer 50 and the sidewalls of the grooves 53 remain free of deposited nickel because they have not been chemically etched and therefore are not receptive to the sensitization, activation and electroless metal deposition.

A polyester resin via layer 28, not shown in FIG. 16, but as shown in FIG. 12, is then deposited on the conductor-groove layer 50 to provide insulation between the conductor layer 50 and the next conductor layer. A mask 45 containing opaque areas 49 is used to form vias appropriately positioned to allow electroless metal interconnection of the conductor layers as described earlier. Also, as with the previously described procedure, the process of adding more conductor layers is merely a repetition of the steps previously recited.

The Resin Layers

Resin Preparation

Polyester resin, such as Paraplex P-43, Rohm & Haas Co., is used for dielectric layers and also for the chip embedment procedures discussed earlier. A photo initiator, or photopolymerization catalyst, such as UV50 Ultraviolet Sensitive Catalyst, U.S. Peroxygen Division, Argus Chemical Corporation, Richmond, Calif., is added to the polyester resin to render it sensitive to ultraviolet light. About 5% by weight of the catalyst is required. Gross particulates are removed from the mixture by filtering with a syringe-filter unit containing a coarse glass-fiber filter. The filtered resin is placed in stoppered plastic syringes and centrifuged to remove air bubbles. It is then refrigerated until required.

Resin Exposure

A 200-watt mercury lamp is used to irradiate and crosslink the resin. The lamp emits light in the wavelengths from 2800 Å to 4200 Å with a major peak at 3650 Å. Some radiation also occurs above 5000 Å. The light is collimated by a 6-inch diameter compound quartz lens of 6-inch focal length. The time required to crosslink the resin varies from a few minutes to several minutes depending on exposure conditions. Several factors which affect exposure time include light intensity, thickness of the resin layer, age of the sensitized resin mixture (days or weeks), resin temperature, material and thickness of the mask, and reflectivity of the substrate surface. Factors affecting resolution include the degree of collimation of the light, light scattering in the resin, texture and reflectivity of the substrate surface, exposure time, and diffraction effects. Pattern resolution is excellent and via holes as small as 1 mil square have been produced in resin.

Polyester resin is photoformed by exposing a liquid resin layer through a photomask. Both contact and projection exposures can be made. In the case of contact exposures, a 0.5-mil Mylar sheet or other suitable film, is placed between the resin and the mask to avoid wetting the mask. The Mylar sheet also excludes oxygen which inhibits resin cure. A projection exposure requires a flat transparent glass, or quartz plate over the Mylar sheet to provide the resin-flattening and oxygen excluding functions performed by the photomask in contact exposures. Resin thickness is measured by the shadow from the mask with 45° incident light.

Projection exposures can be useful and sometimes necessary when pattern definition requirements are stringent. Pressure exerted on the liquid-resin layer by the mask in a contact exposure can cause lateral movement of the resin for periods much longer than the time required for resin exposure. Consequently semicured resin can migrate into areas not intended to become polymerized and interfere with pattern development to the extent that small vias will not develop completely. By lifting the mask off the resin layer and exposing by projection of the pattern, pressure is relieved and the resin stabilizes into a motionless state and extremely high pattern resolution is achieved.

Although Mylar sheet has been used successfully to cover wet resin during exposures, other plastics having similar characteristics possibly may be used instead. These characteristics include suitable optical clarity (freedom from striations), suitable thickness, non-adhesion to the cured polyester resin, ultraviolet transmission capability, and freedom from adhered oxygen on its surface.

While the preferred process of the invention has been described using polyester resin, it may be apparent to those skilled in the art that there may be other plastics which could be substituted for the polyester resin while not departing from the scope of the invention.

There may be circumstances, such as between the two-step exposure of the polyester resin when forming the via layer, where more complete curing than that provided by the ultraviolet source is not required before the next step in processing. However, the preceding specification should be understood to include in all other steps requiring ultraviolet exposures and developing that they be followed by heating and ultraviolet exposure, as from a sunlamp, in a nitrogen atmosphere to completely cure the resin. This latter procedure hardens the resin to a complete cure in a reasonable time, such as twenty minutes. Complete curing without heating could take up to twice that time. Complete curing of the resin is especially important where the resin must be sensitized for subsequent metallization.

Chemical Procedures

Metallizing Back of Array (While still adhered to adhesive coated mask)

1. Abrade backs of chips with 10 micron alumina powder. Rinse.
2. Immerse mask and chips in plastic etch solution for 30 sec. at room temperature.
   Plastic etch solution
   10 ml distilled $H_2O$
   50 ml $H_2SO_4$
   0.5 g. $CrO_3$
   Rinse.
3. Immerse mask and chips in sensitizer bath consisting of
   50 ml distilled $H_2O$
   10 ml HF (48%)
   5 ml $PdCl_2$ solution consisting of $PdCl_2$—0.5 g/l and HCl—1 ml/l
   Time in bath (at room temperature) is 1 min. Rinse.
4. Immerse mask and chips in room temperature electroless boron nickel bath for 2 min. Rinse.
5. Immerse mask and chips in 10% Pallamerse ®, Technic Inc. Providence, R.I., solution for 2-3 min. at room temperature. Rinse.
6. Immerse mask and chips in electroless boron nickel bath for 2-3 min. at room temperature. Rinse.
7. Electroplate copper in acid copper-plating bath to a thickness of 0.2-0.3 mil. Rinse.
   All rinses are distilled water rinses.

Metallization of Chip Pads (Chips are cast in array with layer of polyester covering silicon in scribe-line area.)

1. Degrease chip surfaces in trichloroethylene.
2. Etch 30 sec. in mixture of 90% $H_3PO_4$ (orthophosphoric acid) and 10% $HNO_3$ (nitric acid) at room temperature. Rinse.
3. Etch 15 sec. in pure $H_3PO_4$ at 65° C. Rinse.
4. Immerse 15 seconds in room temperature acid immersion zinc solution compounded as follows:
   5.0 N. $ZnSO_4.7H_2O$ solution
   1.0 N. HF(48%)
   Rinse.
5. Immerse 3 min. in electroless boron nickel solution. Rinse.
   All rinses are distilled water rinses.

Improved Pad-metallization Procedure

1. Degrease chips (or undiced whole wafer) in trichloroethylene
2. Immerse chips or wafer for a time sufficient to completely cover the aluminum with zinc, which time is approximately one minute in approximately 32° C. near-neutral pH immersion zinc solution compounded as follows and in the order indicated:
   a. 100 ml deionized $H_2O$
   b. 2 g. $ZnSO_4.7H_2O$
   c. 2.5 ml HF (48%)
   d. 1 g. Citric Acid, Monohydrate
   e. add $NH_4OH$ to pH 7.3
3. Rinse
4. Immerse three minutes in electroless boron nickel solution
5. Rinse
   All rinses are deionized water rinses Conductor Metallization 1. Etch polyester surface 15-30 seconds in a room-temperature etchant consisting of the following:
   10 ml distilled $H_2O$
   50 ml sulfuric acid ($H_2SO_4$). Add slowly. Cool below 30° C. and slowly add 0.5 g. chromium trioxide ($CrO_3$) while stirring. Rinse.
2. Immerse array in a palladium immersion plating solution known to those skilled in the plating art, for instance a 10% Pallamerse ® solution for 2-3 minutes at room temperature. Rinse.
3. Immerse array in electroless boron nickel bath for 2-3 minutes at room temperature. Rinse.
4. Electroplate copper in acid copper-plating bath to a thickness of 0.3 mil.
   All rinses are distilled water rinses.

What is claimed is:

1. The method of nickeling selected regions of a layer of polymerized polyester resin comprising:
   etching said resin with an etching solution,
   covering said etched resin with a layer of liquid unpolymerized said polyester resin,
   exposing said liquid resin to ultraviolet light through a mask which has opaque regions corresponding to the said selected regions to polymerize the liquid resin to form a second polymerized layer of resin except in said regions,
   developing out the unexposed resin,
   immersing the etched layer and the second layer of resin in a palladium solution for a time sufficient to form an activating layer on the etched resin only, and
   immersing in an electroless boron nickel bath for a time sufficient to provide the desired thickness of nickel on the activating layer,
   whereby electrically conductive regions are formed on the first layer of resin corresponding to the opaque regions on the mask.

2. The method of claim 1 wherein,
   said etching step comprises,
   etching for 15-30 seconds in a room-temperature etchant consisting of the following:
   10 ml distilled $H_2O$,
   50 ml sulfuric acid ($H_2SO_4$), add slowly, cool below 30° C., and slowly
   add 0.5 g. chromium trioxide ($CrO_3$) while stirring, rinsing,
   said palladium immersion step comprises, immersing in a 10% palladium plating solution for 2-3 minutes at room temperature,
   rinsing,
   and said boron bath immersing step comprises, immersing in electroless boron nickel bath for one hour at room temperature,
   rinsing,
   all rinses are distilled water rinses.

3. The method of claim 1 wherein
   said etching, immersing in palladium solution, and immersing in an electroless boron nickel bath steps are at substantially room temperature.

4. The method of claim 1 wherein
   said exposing to ultraviolet light is at a temperature at which thermal polymerization is insufficient to polymerize those portions of the liquid resin under the opaque regions of the mask.

* * * * *